(12) United States Patent
Grillot et al.

(10) Patent No.: US 7,547,908 B2
(45) Date of Patent: Jun. 16, 2009

(54) III-NITRIDE LIGHT EMITTING DEVICES GROWN ON TEMPLATES TO REDUCE STRAIN

(75) Inventors: Patrick N. Grillot, San Jose, CA (US); Nathan F. Gardner, Sunnyvale, CA (US); Werner K. Goetz, Palo Alto, CA (US); Linda T. Romano, Sunnyvale, CA (US)

(73) Assignee: Philips Lumileds Lighting Co, LLC, San Jose, CA (US)

( * ) Notice: Subject to any disclaimer, the term of this patent is extended or adjusted under 35 U.S.C. 154(b) by 110 days.

(21) Appl. No.: 11/615,834

(22) Filed: Dec. 22, 2006

(65) Prior Publication Data

US 2008/0149961 A1  Jun. 26, 2008

(51) Int. Cl.
*H01L 29/06* (2006.01)
(52) U.S. Cl. ............. 257/11; 257/13; 257/189; 257/615; 257/E21.085; 438/48
(58) Field of Classification Search .......... None
See application file for complete search history.

(56) References Cited

U.S. PATENT DOCUMENTS

| | | | |
|---|---|---|---|
| 5,793,054 | A | 8/1998 | Nido |
| 5,864,573 | A | 1/1999 | Miura et al. |
| 5,945,689 | A | 8/1999 | Koike et al. |
| 6,265,289 | B1 | 7/2001 | Zheleva et al. |
| 6,285,696 | B1 | 9/2001 | Bour et al. |
| 6,288,416 | B1 * | 9/2001 | Koike et al. ............ 257/94 |
| 6,455,337 | B1 | 9/2002 | Sverdlov |
| 6,489,636 | B1 | 12/2002 | Goetz et al. |
| 6,599,362 | B2 | 7/2003 | Ashby et al. |
| 6,630,692 | B2 | 10/2003 | Goetz et al. |

(Continued)

FOREIGN PATENT DOCUMENTS

DE  20113042 U1  12/2001

(Continued)

OTHER PUBLICATIONS

T. Bottcher et al., "The role of high-temperature island coalescence in the development of stresses in GaN films," Applied Physics Letters, vol. 78, No. 14, Apr. 2, 2001, pp. 1976-1978.

(Continued)

*Primary Examiner*—Evan Pert
*Assistant Examiner*—Scott R Wilson (57) ABSTRACT

In a III-nitride light emitting device, the device layers including the light emitting layer are grown over a template designed to reduce strain in the device, in particular in the light emitting layer. Reducing the strain in the light emitting device may improve the performance of the device. The template may expand the lattice constant in the light emitting layer over the range of lattice constants available from conventional growth templates. Strain is defined as follows: a given layer has a bulk lattice constant $a_{bulk}$ corresponding to a lattice constant of a free standing material of a same composition as that layer and an in-plane lattice constant $a_{in\text{-}plane}$ corresponding to a lattice constant of that layer as grown in the structure. The amount of strain in a layer is $|(a_{in\text{-}plane} - a_{bulk})|/a_{bulk}$. In some embodiments, the strain in the light emitting layer is less than 1%.

28 Claims, 5 Drawing Sheets

U.S. PATENT DOCUMENTS

| | | | |
|---|---|---|---|
| 6,635,904 | B2 | 10/2003 | Goetz et al. |
| 6,989,555 | B2 * | 1/2006 | Goetz et al. ................ 257/101 |
| 2001/0002048 | A1 | 5/2001 | Koike et al. |
| 2002/0093020 | A1 * | 7/2002 | Edmond et al. ............... 257/79 |
| 2003/0057434 | A1 | 3/2003 | Hata et al. |
| 2003/0085409 | A1 | 5/2003 | Shen et al. |
| 2003/0151043 | A1 * | 8/2003 | Kawanishi et al. ............ 257/13 |
| 2003/0205717 | A1 * | 11/2003 | Khare et al. ................ 257/103 |
| 2006/0192218 | A1 * | 8/2006 | Kyono et al. ................. 257/96 |

FOREIGN PATENT DOCUMENTS

| | | | |
|---|---|---|---|
| GB | 2338107 | A | 12/1999 |
| JP | 411243251 | A | 9/1999 |
| JP | 2001160627 | A | 6/2001 |
| JP | 2007096330 | A * | 4/2007 |
| WO | 9959195 | | 11/1999 |
| WO | 0133643 | A1 | 5/2001 |

OTHER PUBLICATIONS

Kazumasa Hiramatsu, "Epitaxial lateral overgrowth techniques used in group III nitride epitaxy," Institute of Physics Publishing, Journal of Physics Condensed Matter 13 (2001), pp. 6961-6975.

Rachel A. Oliver et al., "Growth modes in heteroepitaxy of InGaN on GaN," Journal of Applied Physics 97, 013707 (2005), pp. 1-8.

S. Figge et al., "In situ and ex situ evaluation of the film coalescence for GaN growth on GaN nucleation layers," Journal of Crystal Growth 221 (2000), pp. 262-266.

Matteo Bosi et al., "A study of Indium incorporation efficiency in InGaN grown by MOVPE," Journal of Crystal Growth 265 (2004), pp. 434-439.

D. D. Koleske et al., "Improved brightness of 380 nm GaN emitting diodes through international delay of the nucleation island coalescence," Applied Physics Letters, vol. 81, No. 11, Sep. 9, 2002, pp. 1940-1942.

F. A. Ponce et al., "Microstructure and electronic properties of InGaN alloys," Phys. Stat. Sol. (b) 240, No. 2, pp. 273-284.

L. T. Romano et al., "Effect of Si doping on strain, cracking, and microstructure in GaN thin films grown by metalorganic chemical vapor deposition," Journal of Applied Physics, vol. 87, No. 11, Jun. 1, 2000, pp. 7745-7752.

Shigetaka Tomiya et al., "Defects and Degradation of Nitride-based Laser Diodes," paper, Proc. of SPIE vol. 6133, 613308, (2006), pp. 1-10.

Yoshio Itoh et al., "GaAs heteroepitaxial growth on Si for solar cells," Appl. Phys. Lett. 52 (19), May 9, 1988, pp. 1617-1618.

International Search Report and Written Opinion, 22 pages.

* cited by examiner

FIG. 1

| Device Layers 6 |
| --- |
| High Temperature Layer 5 |
| High Temperature Layer 3 |
| Nucleation Layer 2 |
| Substrate 1 |

FIG. 2

| Device Layers 10 |
| --- |
| Low Temperature Layer 26 |
| Nucleation Layer 22 |
| Substrate 20 |

FIG. 3

| Low Temperature Layer 26 |
| --- |
| Nucleation Layer 22 |
| Nucleation Layer 22 |
| Nucleation Layer 22 |
| Substrate 20 |

FIG. 4

| Device Layers 10 |
| --- |
| Low Temperature Layer 26 |
| Low Temperature Layer 26 |
| Low Temperature Layer 26 |
| Nucleation Layer 22 |
| Substrate 20 |

FIG. 5

| Device Layers 10 |
| --- |
| Low Temperature Layer 26 |
| Nucleation Layer 22 |
| Low Temperature Layer 26 |
| Nucleation Layer 22 |
| Substrate 20 |

FIG. 6

| Cap Layer 38 |
| --- |
| Low InN LowTemperature Layer 36 |
| Med InN Low Temperature Layer 34 |
| High InN Low Temperature Layer 32 |

FIG. 7

| Device Layers 10 |
| --- |
| InGaN Region 35 |

FIG. 8

| Device Layers 10 |
| --- |
| Low Temperature Layer 26 |
| High Temperature Layer 24 |
| Nucleation Layer 22 |
| Substrate 20 |

FIG. 9

| Device Layers 10 |
| --- |
| High Temperature Layer 28 |
| Low Temperature Layer 26 |
| Nucleation Layer 22 |
| Substrate 20 |

FIG. 10

| Device Layers 10 |
| --- |
| High Temperature Layer 28 |
| Low Temperature Layer 26 |
| High Temperature Layer 24 |
| Nucleation Layer 22 |
| Substrate 20 |

FIG. 11

| Device Layers 10 |
| --- |
| High Temperature Layer 28 |
| Low Temperature Layer 26 |
| High Temperature Layer 30 |
| High Temperature Layer 24 |
| Nucleation Layer 22 |
| Substrate 20 |

FIG. 12

| Device Layers 10 |
| --- |
| High Temperature Layer 28 |
| High Temperature Layer 31 |
| Low Temperature Layer 26 |
| High Temperature Layer 24 |
| Nucleation Layer 22 |

FIG. 13

| Device Layers 10 |
| --- |
| Optional Cap Layer 67 |
| Third InN Poor Layer 65 |
| Third InN Rich Layer 64 |
| Second InN Poor Layer 63 |
| Second InN Rich Layer 62 |
| First InN Poor Layer 61 |
| First InN Rich Layer 60 |
| Low Temperature Layer 26 |

FIG. 14

| Device Layers 10 |
| --- |
| Graded InGaN Layer 59 |
| Low Temperature Layer 26 |

III-NITRIDE LIGHT EMITTING DEVICES GROWN ON TEMPLATES TO REDUCE STRAIN

BACKGROUND

1. Field of Invention

The present invention relates to growth techniques and device structures for semiconductor light emitting devices.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the UV, visible, and possibly the infrared spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions. These III-nitride materials are also of interest for other optoelectronic and also electronic devices, such as field effect transistors (FETs), and detectors.

SUMMARY

In embodiments of the invention, the device layers including the light emitting layer of a III-nitride device are grown over a template designed to reduce strain in the device, in particular in the light emitting layer. This strain may be defined as follows: a given layer has a bulk lattice constant $a_{bulk}$ corresponding to a lattice constant of a free standing material of a same composition as that layer, and an in-plane lattice constant $a_{in\text{-}plane}$ corresponding to a lattice constant of that layer as grown in the structure. The amount of strain in a layer is the difference between the in-plane lattice constant of the material forming a particular layer and the bulk lattice constant of the layer in the device, divided by the bulk lattice constant.

Reducing the strain in the light emitting device may improve the performance of the device. The template may expand the lattice constant in the light emitting layer over the range of lattice constants available from conventional growth templates. In some embodiments of the invention, the strain in the light emitting layer is less than 1%.

In some embodiments, the template includes two layers grown at low temperature, an indium-free nucleation layer such as GaN grown directly on the substrate and an indium-containing layer such as InGaN grown over the indium-free layer. Both layers may be non-single crystal layers. In some embodiments, a single crystal layer such as a GaN layer may be grown between the nucleation layer and the indium-containing layer. In some embodiments, a single crystal layer such as GaN, InGaN, or AlInGaN may be grown over the low temperature indium-containing layer.

In some embodiments, the template further includes a multiple layer stack or a graded region, or is formed by a process including a thermal anneal or thermal cycled growth step.

DETAILED DESCRIPTION

The performance of a semiconductor light emitting device may be gauged by measuring the external quantum efficiency, which measures the number of photons extracted from the device per electron supplied to the device. As the current density applied to a conventional III-nitride light emitting device increases, the external quantum efficiency of the device initially increases, then decreases. As the current density increases past zero, the external quantum efficiency increases, reaching a peak at a given current density (for example, at about 10 A/cm$^2$ for some devices). As current density increases beyond the peak, the external quantum efficiency initially drops quickly, then the decrease slows at higher current density (for example, beyond 200 A/cm$^2$ for some devices). The quantum efficiency of a device also decreases as the InN composition in the light emitting region increases and as the wavelength of emitted light increases.

One technique to reduce or reverse the drop in quantum efficiency at high current density is to form thicker light emitting layers. However, growth of thick III-nitride light emitting layers is difficult because of the strain in III-nitride device layers. Also, in order to achieve emission at longer wavelengths, the incorporation of higher InN composition is desirable. However, growth of high InN composition III-nitride light emitting layers is difficult because of the strain in III-nitride device layers.

Since native III-nitride growth substrates are generally expensive, not widely available, and impractical for growth of commercial devices, III-nitride devices are often grown on sapphire ($Al_2O_3$) or SiC substrates. Such non-native substrates have different lattice constants than the bulk lattice constants of the III-nitride device layers grown on the substrate, different thermal expansion coefficients, and different chemical and structural properties than the device layers, resulting in strain in the device layers, and chemical and structural mismatch between the device layers and the substrates. Examples of this structural mismatch can include, for example, an in-plane rotation between the crystal structure of GaN and the crystal structure of the sapphire substrate that the GaN is grown on.

As used herein, an "in-plane" lattice constant refers to the actual lattice constant of a layer within the device, and a "bulk" lattice constant refers to the lattice constant of relaxed, free-standing material of a given composition. The amount of strain in a layer is defined in Eq. (1).

$$\text{strain} = \epsilon = (a_{in\text{-}plane} - a_{bulk})/a_{bulk} \quad (1)$$

Note that strain, $\epsilon$, in Eq. (1) can be either positive or negative, i.e., $\epsilon > 0$ or $\epsilon < 0$. In an unstrained film, $a_{in\text{-}plane} = a_{bulk}$, so $\epsilon = 0$ in Eq. (1). A film where $\epsilon > 0$ is said to be under tensile strain, or under tension, while a film where $\epsilon < 0$ is said to be under compressive strain, or under compression. Examples of tensile strain include a strained AlGaN film grown over unstrained GaN, or a strained GaN film grown over unstrained InGaN. In both cases, the strained film has a bulk lattice constant that is smaller than the bulk lattice constant of the unstrained layer on which it is grown, so the in-plane lattice constant of the strained film is stretched to match that of the unstrained layer, giving $\epsilon > 0$ in Eq. (1), according to which the film is said to be under tension. Examples of compressive strain include a strained InGaN film grown over unstrained GaN, or a strained GaN film grown over unstrained AlGaN. In both cases, the strained film has a bulk lattice constant that is larger than the bulk lattice constant of the unstrained layer on which it is grown, so the in-plane lattice constant of the strained film is compressed to match that of the unstrained layer, giving $\epsilon < 0$ in Eq. (1), according to which the film is said to be under compression.

In a tensile film, the strain acts to pull the atoms apart from one another in order to increase the in-plane lattice constant. This tensile strain is often undesirable, because the film can respond to the tensile strain by cracking, which decreases the strain in the film, but compromises the structural and electrical integrity of the film. In a compressive film, the strain acts to push the atoms together, and this effect can decrease the incorporation of large atoms such as indium in an InGaN film, for example, or can decrease the material quality of the InGaN active layer in an InGaN LED. In many cases, tensile and compressive strain are both undesirable, and it is beneficial to decrease the tensile or compressive strain in the various layers of the device. In such cases, it is more convenient to refer to the absolute value, or magnitude of the strain, as defined in Eq. (2). As used herein, the term "strain" shall be understood to mean the absolute value, or magnitude of the strain, as defined in Eq. (2).

$$\text{strain} = |\epsilon| = |(a_{in\text{-}plane} - a_{bulk})|/a_{bulk} \quad (2)$$

When a III-nitride device is conventionally grown on $Al_2O_3$, the first structure grown on the substrate is generally a GaN template layer with an in-plane a-lattice constant of about 3.189 Å or less. The GaN template serves as a lattice constant template for the light emitting region in that it sets the lattice constant for all of the device layers grown above the template layer, including the InGaN light emitting layer. Since the bulk lattice constant of InGaN is larger than the in-plane lattice constant of the conventional GaN template, the light emitting layer is compressively strained when grown over a conventional GaN template. For example, a light emitting layer configured to emit light of about 450 nm may have a composition $In_{0.16}Ga_{0.84}N$, a composition with a bulk lattice constant of 3.242 Å, as compared to the lattice constant of GaN, 3.189 Å. As the InN composition in the light emitting layer increases, as in devices designed to emit light at longer wavelengths, the compressive strain in the light emitting layer also increases.

If the thickness of the strained layer increases beyond a critical value, dislocations or other defects form within the layer to reduce the energy associated with the strain, as described in Tomiya et al., *Proceedings of SPIE*, volume 6133, pages 613308-1-613308-10 (2006), which is incorporated herein by reference. The structural defects can associate with non-radiative recombination centers which can considerably reduce the quantum efficiency of the device. As a result, the thickness of the light emitting layer must be kept below this critical thickness. As the InN composition and peak wavelength increase, the strain in the light emitting layer increases, thus the critical thickness of a light emitting layer decreases.

Even if the thickness of the light emitting layer is kept below the critical thickness, InGaN alloys are thermodynamically unstable at certain compositions and temperatures, as described in Ponce et al., *Physica Status Solidi*, volume B 240, pages 273-284 (2003), which is incorporated herein by reference. For example, at temperatures typically used for InGaN growth, InGaN may exhibit spinodal decomposition, where a compositionally uniform InGaN layer transforms into a layer with regions of higher-than-average InN composition and regions of lower-than-average InN composition. Spinodal decomposition in an InGaN light emitting layer creates non-radiative recombination centers and may increase internal absorption, which may reduce the quantum efficiency of the device. The problem of spinodal decomposition worsens as the thickness of the light emitting layer increases, as the average InN composition in the light emitting layer increases, and/or as the strain in the light emitting layer increases. For example, in the case of a light emitting layer grown on a GaN template and configured to emit light at 550 nm, the combination of InN composition of >20% and the preferred thickness of >30 Å exceeds the spinodal decomposition limit.

Accordingly, as described above, it is desirable to increase the thickness of the light emitting layer to reduce or eliminate the drop in external quantum efficiency that occurs as the current density increases, or it is desirable to increase the InN composition to achieve longer emission wavelength. In both cases, it is necessary to reduce the strain in the light emitting layer in order to grow a thicker or higher composition light emitting layer, to keep the number of defects within an acceptable range by increasing the critical thickness, and to increase the thickness at which layer can be grown without spinodal decomposition. Embodiments of the invention are designed to reduce strain in the device layers of a III-nitride device, in particular in the light emitting layer.

Figure 1:
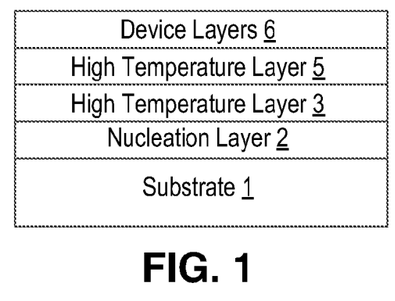
FIG. 1 is a cross sectional view of a portion of a device according to the prior art.

FIG. 1 illustrates a device with a conventional nucleation layer 2 grown on a substrate 1. One or more high temperature layers, 3 and 5, may be grown over nucleation layer 2, and device layers 6 may be grown over high temperature layer 3 or 5. Previous methods of reducing strain in III-nitride light emitting layers include growing a high temperature, substantially single crystal InGaN region 5 over a coalesced GaN region 3, as illustrated in FIG. 1 and described in U.S. Pat. No. 6,489,636, or growing an indium-containing nucleation layer 2 directly on a sapphire substrate, as illustrated in FIG. 1 and described in UK Patent Application GB 2 338 107 A. However, the InGaN region grown over coalesced GaN typically does not relax efficiently and thus provides limited reduction of strain and associated defects, and the approach described in UK Patent Application GB 2 338 107 A, which includes an indium-containing nucleation layer grown directly on sapphire typically results in one or more problems in the device layers, including high dislocation densities, rough surfaces and high concentrations of impurities such as carbon and oxygen. Accordingly, it is necessary to control not only the strain in the device layers, but also dislocation density and surface roughness.

Another method of controlling strain in conventional GaN templates such as shown in FIG. 1 is to control the dislocation density in the GaN template, as described in Böttcher et al., *Applied Physics Letters*, volume 78, pages 1976-1978 (2001), which is incorporated herein by reference. In this approach, the a-lattice constant increases with increasing threading dislocation density (TDD). While the exact relationship between a-lattice constant and threading dislocation density depends on many factors, including Si concentration, growth temperature, and template thickness, an approximate relationship between a-lattice constant and threading dislocation density in conventional GaN templates can be described as $$a_{in\text{-}plane} = 3.1832 + 9.578 \times 10^{-13} * TDD \tag{3}$$

Note from Eq. (3) that an in-plane a-lattice constant of 3.189 Å corresponds to a threading dislocation density of approximately $6 \times 10^9$ cm$^{-2}$. While this a-lattice constant can be achieved at lower threading dislocation densities using different Si concentrations, different growth temperatures, or different template thicknesses, the inventors have observed that a conventional GaN template with an a-lattice constant greater than 3.189 Å generally has a threading dislocation density of at least $2 \times 10^9$ cm$^{-2}$. By varying the threading dislocation density in conventional GaN templates such as that in FIG. 1, the inventors have varied the in-plane a-lattice constant in conventional GaN templates over the range from approximately 3.1832 Å to approximately 3.1919 Å.

While increasing the threading dislocation density is thus generally effective at increasing the a-lattice constant in conventional GaN templates, this method has several disadvantages. For example, defects such as dislocations act as non-radiative recombination centers, which can decrease the external quantum efficiency of III-nitride light emitting devices, as described in Koleske et al., *Applied Physics Letters*, volume 81, pages 1940-1942 (2002), which is incorporated herein by reference. It is therefore desirable to reduce the dislocation density in order to increase the external quantum efficiency. Also, as the in-plane a-lattice constant approaches and exceeds approximately 3.189 Å in conventional GaN templates, GaN layers tend to crack due to excessive tensile strain, as described in Romano et al., *Journal of Applied Physics*, volume 87, pages 7745-7752 (2000), which is incorporated herein by reference. It is therefore desired to break this relationship between a-lattice constant and dislocation density which is mandated by binary composition GaN templates. In particular, achieving low strain active layers in combination with low threading dislocation density templates is an important goal for increasing the external quantum efficiency and wavelength of III-nitride LEDs. In some embodiments of the invention, the template on which the device layers are grown is substantially crack-free with a combination of an in-plane a-lattice constant as large as 3.200 Å and a threading dislocation density below $2 \times 10^9$ cm$^{-2}$.

In embodiments of the invention, the device layers of a semiconductor light emitting device are grown over a structure, referred to herein as a template, incorporating a component for controlling the lattice constant (and therefore strain) in the device layers. Structures that increase the lattice constant in the device may cause undesirably increased surface roughness or increased threading dislocation density, thus the template may also include components for controlling the threading dislocation density and surface roughness in the device layers, particularly in the light emitting region. The template sets the threading dislocation density and lattice constant of the semiconductor layers grown over the template. The template serves as a lattice constant transition from the lattice constant of GaN to a lattice constant more closely matched to the bulk lattice constant of the light emitting layer. The lattice constant set by the template can be more closely matched to the bulk lattice constant of the device layers than the lattice constant available in devices grown on conventional templates, resulting in less strain at an acceptable threading dislocation density and surface roughness, as compared with devices grown on conventional GaN templates.

The device layers referred to above include at least one light emitting layer sandwiched between at least one n-type layer and at least one p-type layer. Additional layers of different compositions and dopant concentration may be included in each of the n-type region, light emitting region, and p-type region. For example, the n- and p-type regions may include layers of opposite conductivity type or layers that are not intentionally doped, release layers designed to facilitate later release of the growth substrate or thinning of the semiconductor structure after substrate removal, and layers designed for particular optical or electrical properties desirable for the light emitting region to efficiently emit light. In some embodiments, the n-type layer sandwiching the light emitting layer may be part of the template.

In the embodiments described below, the InN composition in the light emitting layer or layers may be low, such that the device emits blue or UV light, or high, such that the device emits green or longer wavelength light. In some embodiments, the device includes one or more quantum well light emitting layers. Multiple quantum wells may be separated by barrier layers. For example, each quantum well may have a thickness greater than 15 Å.

In some embodiments, the light emitting region of the device is a single, thick light emitting layer with a thickness between 50 and 600 Å, more preferably between 100 and 250 Å. The optimal thickness may depend on the number of defects within the light emitting layer. The concentration of defects in the light emitting region is preferably limited to less than $10^9$ cm$^{-2}$, more preferably limited to less than $10^8$ cm$^{-2}$, more preferably limited to less than $10^7$ cm$^{-2}$, and more preferably limited to less than $10^6$ cm$^{-2}$.

In some embodiments, at least one light emitting layer in the device is doped with a dopant such as Si to a dopant concentration between $1\times10^{18}$ cm$^{-3}$ and $1\times10^{-20}$ cm$^{-3}$. Si doping may influence the in-plane a lattice constant in the light emitting layer, potentially further reducing the strain in the light emitting layer.

In some embodiments of the invention, the template includes at least one low temperature InGaN layer. It has been observed that $H_2$ can affect the incorporation of indium in InGaN films, as described in Bosi and Fornari, *Journal of Crystal Growth*, volume 265, pages 434-439 (2004), which is incorporated herein by reference. Various other parameters, such as growth temperature, growth pressure, growth rate, and $NH_3$ flow can also affect the incorporation of indium in InGaN films as described in part in Oliver et al., *Journal of Applied Physics*, volume 97, pages 013707-1-013707-8 (2005), which is incorporated herein by reference. Variable $H_2$ flow is thus sometimes used as a means of controlling the InN composition in InGaN or AlInGaN films. In some embodiments, the templates described herein are therefore grown using one or more of variable $H_2$ flow, variable $N_2$ flow, or variable $NH_3$ flow into the reactor during template growth. In other embodiments, the templates are grown using variable temperature or variable pressure, or variable growth rate during template growth. In other embodiments, the templates are grown using an arbitrary combination of one or more of variable $H_2$ flow, variable $N_2$ flow, variable $NH_3$ flow, variable temperature, variable pressure, or variable growth rate during template growth.

Figure 2:
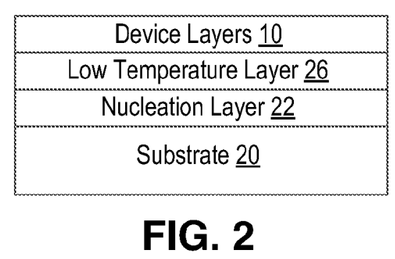
FIG. 2 is a cross sectional view of a portion of a device including a low temperature InGaN layer grown after a conventional low temperature nucleation layer.

FIG. 2 illustrates a first embodiment of the invention. A conventional low temperature nucleation layer 22 is grown directly on the surface of sapphire substrate 20. Nucleation layer 22 is typically a low quality, non-single crystal layer such as an amorphous, polycrystalline, or cubic phase GaN layer grown to a thickness of, for example, up to 500 angstroms, at a temperature between 400 and 750° C.

A second layer 26 is also grown at low temperature above nucleation layer 22. Low temperature layer 26 may be, for example, a low quality, non-single crystal layer such as an amorphous, polycrystalline, or cubic phase III-nitride layer grown to a thickness of, for example, up to 500 angstroms, at a temperature between 400 and 750° C., more preferably between 450 and 650° C., more preferably between 500 and 600° C. In some embodiments, low temperature layer 26 is less than 300 angstroms thick. Low temperature layer 26 may be, for example, an InGaN layer with an InN composition greater than 0% and often less than 20%, more preferably between 3% and 6%, more preferably between 4% and 5%. In some embodiments, the InN composition in low temperature layer 26 is small, for example less than 2%. The structure may be annealed after growth of nucleation layer 22 but before growth of low temperature layer 26, after growth of low temperature layer 26, or both. For example, the structure may be annealed at a temperature between 950 and 1150° C. for between 30 seconds and 30 minutes, generally in an ambient of $H_2$ and $NH_3$; $N_2$ and $NH_3$; or $H_2$, $N_2$, and $NH_3$. In some embodiments, Ga, Al, or In precursors may be introduced during at least part of the annealing process. Device layers 10 are then grown above low temperature layer 26. Low temperature layer 26 may expand the lattice constant of device layers 10 beyond the range of lattice constants achievable with conventional nucleation structures such as conventional GaN templates. Expansion of the lattice constant occurs because the low temperature layer 26 is not grown commensurate with the underlying layers, much as the GaN nucleation layer has a different lattice constant than the sapphire, or SiC, or other substrate on which it is grown. Thus, as described above, low temperature layer 26 serves as a transition from the lattice constant of nucleation layer 22 to a larger lattice constant. A III-nitride device using a low temperature InGaN layer 26 as shown in FIG. 2 may be grown to higher quality than a III-nitride device using an InN-containing nucleation layer 2 grown directly on the substrate, for example as shown in FIG. 1 and described in UK Patent Application GB 2 338 107 A.

In some embodiments, low temperature layer 26 may be composed of AlGaN or AlInGaN instead of InGaN, such that low temperature layers 26 decrease the lattice constant established by nucleation layer 22 in order to decrease the tensile strain in the AlGaN light emitting region of a UV device. The light emitting active layers of such devices may be, for example, AlGaN or AlInGaN.

Figure 3:
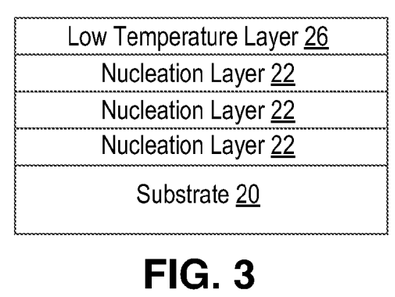
FIG. 3 is a cross sectional view of a portion of a device including a low temperature InGaN layer grown over multiple low temperature nucleation layers.
Figure 4:
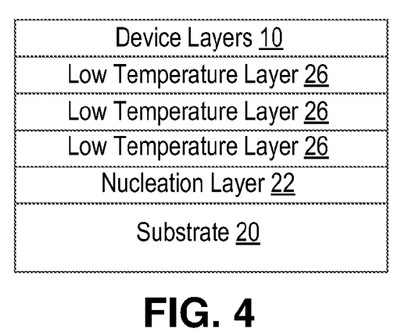
FIG. 4 is a cross sectional view of a portion of a device including multiple low temperature layers grown over a conventional low temperature nucleation layer.
Figure 5:
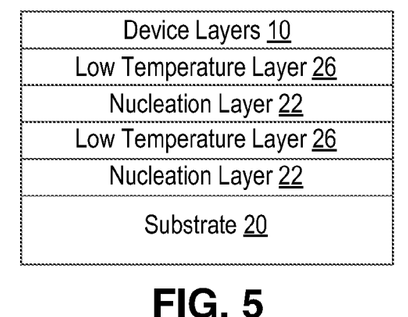
FIG. 5 is a cross sectional view of a portion of a device including more than one set of a low temperature nucleation layer and a low temperature InGaN layer.

In some embodiments of the invention, the device illustrated in FIG. 2 may include one or more multiple layer stacks. Examples of multiple layer stacks include multiple nucleation layers 22 or multiple low temperature layers 26. For example, one or more additional GaN nucleation layers may be disposed between substrate 20 and InGaN low temperature layer 26, as shown in FIG. 3. Alternatively, multiple InGaN low temperature layers 26 may be grown after nucleation layer 22, as shown in FIG. 4. In another example of a device that includes a template with multiple layer stacks, the sequence of a GaN low temperature layer 22 followed by an InGaN low temperature layer 26 may be repeated one or more times, as shown in FIG. 5. The use of multiple nucleation or low temperature layers may reduce the threading dislocation density and the stacking fault density in the device.

Figure 6:
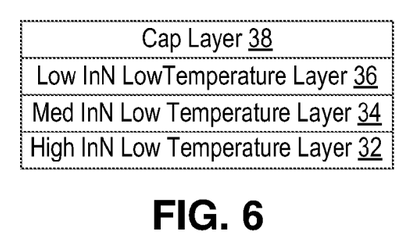
FIG. 6 is a cross sectional view of a portion of a device including multiple low temperature InGaN layers.

In some embodiments, multiple low temperature layers 26 in FIG. 4 or FIG. 5 may have unequal InN composition, or unequal thickness, as illustrated by multiple low temperature layers 32, 34, and 36 in FIG. 6. The structure shown in FIG. 6 may be grown directly on a conventional substrate 20, or over a nucleation layer 22, as illustrated in FIG. 2. The low temperature layer closest to the substrate, layer 32, may have the highest composition of indium, while the low temperature layer furthest from the substrate, layer 36, may have the lowest composition of indium. In another embodiment, the low temperature layer closest to the substrate, layer 32, may have the lowest composition of indium, while the low temperature layer furthest from the substrate, layer 36, may have the highest composition of indium. Alternatively, any arbitrary sequence of low temperature layers may be used. A GaN cap layer 38 may be formed over the top low temperature layer. Each of the low temperature layers need not be the same thickness. For example, layers of lower indium composition may be thicker than layers of higher indium composition. More or fewer than the three low temperature layers shown in FIG. 6 may be used. In addition, multiple stacks of the low temperature layers illustrated in FIG. 6 may be included in the device. Each of these layers may range in thickness from 10 angstroms to 1000 angstroms or more in thickness.

Figure 7:
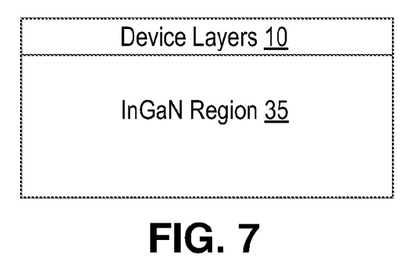
FIG. 7 is a cross sectional view of the structure of FIG. 6 after annealing and growth of device layers.

The structure shown in FIG. 6 may be annealed one or more times after the growth of one or more layers 32, 34, 36, or 38. This annealing process may cause InGaN low temperature layers 32, 34, 36, and GaN cap layer 38 to intermingle to form a single InGaN region 35 as shown in FIG. 7, over which device layers 10 are grown. GaN cap layer 38 in FIG. 6 may reduce the amount of InN driven out of InGaN low temperature layers 32, 34, and 36 during the anneal. Conditions for the anneal are selected such that the final structure has a smooth surface and low defect density. In some embodiments, the anneal includes a growth pause. For example, the structure may be annealed for between 30 seconds and 30 minutes at a temperature between 950 and 1150° C. After growth of low temperature layers 32, 34, and 36, the temperature may be raised to the growth temperature of cap layer 38 or the next layer to be grown, then there is a growth pause prior to growth of cap layer 38 or the next layer. In other embodiments, the anneal is simply the increase in temperature in the growth reactor after growth of low temperature layers 32, 34, and 36 to the growth temperature of cap layer 38. In some embodiments, growth of cap layer 38 begins before the temperature in the growth reactor reaches the desired growth temperature of cap layer 38. In some embodiments, cap layer 38 may be grown at low temperature similar to that used to grow nucleation layer 22. In the structure of low temperature layers 32, 34, and 36 and cap layer 38, the low InN composition layers may help suppress the loss of InN from the high InN composition layers during the anneal.

The multiple layer stacks in FIGS. 3 or 4 or 5 or the graded InN-containing layers 32, 34 and 36 in FIG. 6 and graded InN-containing layer 35 in FIG. 7 may replace the single low temperature layer 26 shown in any of the embodiments described herein. As used herein, the term "graded" when describing the composition or dopant concentration in a layer or layers in a device is meant to encompass any structure that achieves a change in composition and/or dopant concentration in any manner other than a single step in composition and/or dopant concentration. Each graded layer may be a stack of sublayers, each of the sublayers having a different dopant concentration or composition than either sublayer adjacent to it. If the sublayers are of resolvable thickness, the graded layer is a step-graded layer. In some embodiments, the sublayers in a step-graded layer may have a thickness ranging from several tens of angstroms to several thousands of angstroms. In the limit where the thickness of individual sublayers approaches zero, the graded layer is a continuously-graded region. The sublayers making up each graded layer can be arranged to form a variety of profiles in composition and/or dopant concentration versus thickness, including, but not limited to, linear grades, parabolic grades, and power-law grades. Also, graded layers are not limited to a single grading profile, but may include portions with different grading profiles and one or more portions with substantially constant composition and/or dopant concentration regions.

In one example, layers 32, 34, and 36 may be composed of InGaN with InN compositions of 9%, 6%, and 3%, respectively. In another example, layers 32, 34, and 36 may have InN compositions of 9%, 3%, and 9%. After annealing, intermingled region 35 in FIG. 7 may have an InN composition that decreases monotonically from bottom to top, increases monotonically from bottom to top, or varies in a non-monotonic way.

Figure 8:
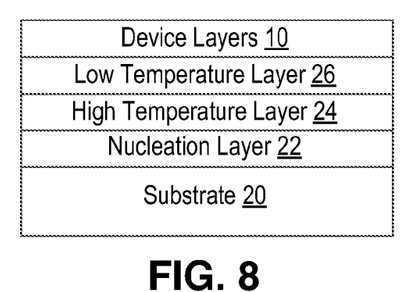
FIG. 8 is a cross sectional view of a portion of a device including a low temperature InGaN layer grown after a high temperature GaN layer.

In some embodiments of the invention, the device layers of a semiconductor light emitting device are grown over a template including at least one low temperature layer grown over a high temperature layer. The high temperature layer may establish a low threading dislocation density and a smooth surface morphology, for example, while the low temperature layer establishes an expanded lattice constant for layers grown on the template. Expansion of the lattice constant occurs because the low temperature layer 26 is not grown commensurate with the underlying layers, much as the GaN nucleation layer has a different lattice constant than the sapphire, or SiC, or other substrate on which it is grown. FIG. 8 is a cross sectional view of a portion of such a device.

In the device shown in FIG. 8, a high temperature layer 24 is grown over nucleation layer 22, which is the same as the nucleation layer 22 described above in reference to FIG. 2. High temperature layer 24 may be, for example, a high quality, crystalline GaN, InGaN, AlGaN, or AlInGaN layer grown to a thickness of at least 500 angstroms, at a temperature between 900 and 1150° C.

After growth of high temperature layer 24, the temperature is dropped and a low temperature layer 26 is grown. In some embodiments, low temperature layer 26 is grown at a growth rate between 0.1 and 10 Å/s, more preferably less than 5 Å/s, more preferably between 0.5 and 2 Å/s, to avoid an undesirably rough surface. Low temperature layer 26 may be, for example, a low quality, non-single crystal layer such as an amorphous, polycrystalline, or cubic layer grown to a thickness of, for example, up to 500 angstroms, at a temperature between 400 and 750° C., more preferably between 450 and 650° C., more preferably between 500 and 600° C. At higher temperatures, low temperature layer 26 may replicate the lattice constant of the underlying layers, rather than relaxing or establishing its own lattice constant, as desired. Low temperature layer 26 is grown at a temperature low enough that it does not replicate the lattice constant of high temperature layer 24; rather, low temperature layer 26 may have a lattice constant larger than the lattice constant of high temperature layer 24, possibly due to the poor quality of low temperature layer 26. Low temperature layer 26 may be, for example, an InGaN layer with an InN composition between 1% and 20%, more preferably between 3% and 6%, more preferably between 4% and 5%. Low temperature layer 26 serves as a transition from the lattice constant of GaN nucleation layer 22 to a larger lattice constant more closely matched to the bulk lattice constant of the light emitting layer of the device.

In some embodiments, the difference between the growth temperature of high temperature layer 24 and low temperature layer 26 is at least 300° C., more preferably at least 450° C., and more preferably at least 500° C. For example, high temperature layer 24 may be grown at a temperature between 900 and 1150° C., while low temperature layer 26 is grown at a temperature between 450 and 650° C.

Due to the low growth temperature used to grow layer 26 in the various embodiments of this invention, low temperature layer 26 may have a high carbon content. In some embodiments, the carbon content in low temperature layer 26 is between $1 \times 10^{18}$ cm$^{-3}$ and $1 \times 10^{20}$ cm$^{-3}$, often between $1 \times 10^{18}$ cm$^{-3}$ and $1 \times 10^{19}$ cm$^{-3}$. In contrast, the carbon content of high temperature layer 24 is generally less than $5 \times 10^{17}$ cm$^{-3}$, more preferably less than $1 \times 10^{17}$ cm$^{-3}$, more preferably less than $1 \times 10^{16}$ cm$^{-3}$. Due to the high carbon content, low temperature layer 26 may absorb light emitted by the active layer. In a preferred embodiment, the thickness of low temperature layer 26 is thus limited to less than 1000 Å, more preferably less than 500 Å, and more preferably less than 300 Å.

Also due to the low growth temperature, lattice mismatch, and thermal expansion mismatch, low temperature layer 26 may have a high concentration of defects such as stacking faults, dislocation loops, and dislocation lines that are located at or near the interface between low temperature layer 26 and the layer grown directly over low temperature layer 26 or at or near the interface between low temperature layer 26 and the layer on which low temperature layer 26 is grown. The defects are often oriented roughly parallel to a growth interface between substrate 20 and nucleation layer 22. The density of these in-plane defects contributes to the strain relaxation of low temperature layer 26 and the layers grown over low temperature layer 26. Note that the concentration of these in-plane defects is not necessarily related to the threading dislocation density described above in reference to Eq. (3). In a given high temperature layer 24, no stacking faults or dislocations parallel to the growth interface are observed by transmission electron microscope (TEM), indicating a density of stacking faults and dislocations parallel to the growth interface below the detection limit of TEM, typically about $1\times10^2$ cm$^{-1}$. TEM images of an InGaN low temperature layer 26 reveal many dislocations parallel to the growth interface for a TEM sample thickness on the order of several thousand angstroms, indicating a density of dislocations that are parallel to the growth interface of at least $1\times10^2$ cm$^{-1}$, more likely $1\times10^3$ cm$^{-1}$, and more likely at least $1\times10^4$ cm$^{-1}$. In some embodiments, the density of dislocations parallel to the growth interface is between $1\times10^2$ cm$^{-1}$ and $1\times10^7$ cm$^{-1}$.

In some embodiments, low temperature layer 26 may be grown in a manner such that it is discontinuous in the growth plane, i.e., it may have intentional or unintentional features that make it non-planar or discontinuous. Examples of such intentional features may include the use of one or more of a class of techniques involving lateral overgrowth. These techniques are referred to using various terms, including epitaxial lateral overgrowth (ELO or ELOG), facet-controlled epitaxial lateral overgrowth (FACELO), and Pendeo epitaxy (PE), as described in Hiramatsu, *Journal of Physics: Condensed Matter*, volume 13, pages 6961-6975 (2001), which is incorporated herein by reference. Examples of such unintentional features may include the presence of V-shaped defects (commonly known as "pits") that intersect the upper surface of low temperature III-nitride layers, large surface steps, and other defects in low temperature layer 26, or in the layer or layers below low temperature layer 26. The use of one or more of these intentional lateral overgrowth techniques or unintentional techniques may limit the lateral extent of the defective region to a small portion or a number of small portions of the template, while the lateral overgrowth of the template may maintain the large lattice constant established by low temperature layer 26.

Figure 9:
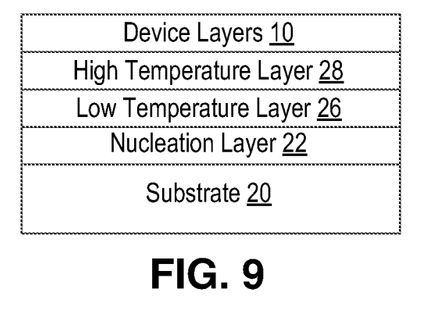
FIG. 9 is a cross sectional view of a portion of a device including a high temperature InGaN layer grown after a low temperature InGaN layer.

In some embodiments, device layers are grown directly on low temperature layer 26 of FIG. 8. In another embodiment, an additional high temperature layer 28 may be grown above low temperature layer 26, replicating the lattice constant established by low temperature layer 26, as shown in FIG. 9. High temperature layer 28 may be, for example, GaN, InGaN, AlGaN, or AlInGaN. In some embodiments, high temperature layer 28 is InGaN grown to a thickness between 500 and 10,000 angstroms, at a temperature between 800 and 1000° C. The InN composition in high temperature layer 28 is generally less than the InN composition in low temperature layer 26, and may be, for example, between 0.5% and 20%, more preferably between 3% and 6%, more preferably between 4% and 5%.

Figure 10:
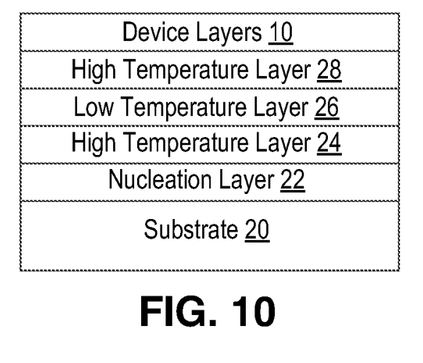
FIG. 10 is a cross sectional view of a portion of a device including a high temperature InGaN layer grown after a low temperature InGaN layer grown after a high temperature GaN layer.

Low temperature layer 26 is intended to increase the lattice constant of subsequently grown layers, while high temperature layer 28 is intended to smooth over or fill in pits, large surface steps, and other defects in low temperature layer 26. High temperature layer 28 provides a high quality base on which to grow subsequent layers. The InN composition of low temperature layer 26 is relatively high, in order to expand the lattice constant as much as possible, and the InN composition of high temperature layer 28 is relatively low, in order to grow a layer of desirably high quality. The device illustrated in FIG. 9 may include multiple sets of low temperature layer 26 and high temperature layer 28 between the substrate and the device layers. The lattice constant may be expanded a small amount with each set by increasing the InN composition in the low temperature layers 26 from a lowest InN composition in the low temperature layer 26 closest to the substrate to a highest InN composition in the low temperature layer 26 closest to the device layers. As the lattice constant expands, the InN composition at which it is possible to grow an acceptably high quality high temperature layer 28 may also increase. Thus, the InN composition in the high temperature layers 28 may increase from a lowest InN composition in the high temperature layer 28 closest to the substrate to a highest InN composition in the high temperature layer 28 closest to the device layers. While increasing InN composition in layers 26 is one method of increasing the InN composition of layers 28, the composition of layers 28 may be increased by other methods without increasing the InN composition of layers 26. In another embodiment shown in FIG. 10, high temperature layer 24 from FIG. 8 may be used in combination with high temperature layer 28 in FIG. 9.

Figure 11:
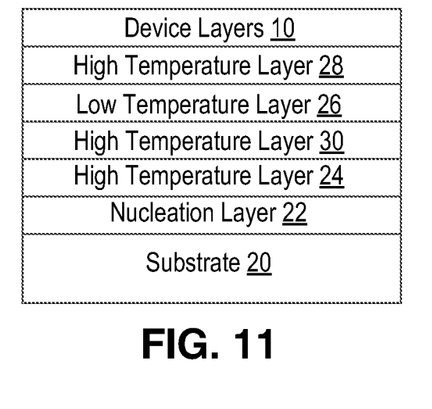
FIG. 11 is a cross sectional view of a portion of a device including a low temperature InGaN layer disposed between two high temperature InGaN layers.

In another embodiment shown in FIG. 11, a low temperature nucleation layer 22 is grown first, followed by a high temperature layer 24 as described above in reference to FIG. 8. A second high temperature layer 30 is grown over high temperature layer 24, and a low temperature InGaN layer 26 is grown over layer 30. High temperature layer 28 is then grown over low temperature layer 26, and device layers 10 are grown above high temperature layer 28. Alternatively, high temperature layer 28 may be omitted in FIG. 11, and device layers 10 may be grown directly on top of low temperature InGaN layer 26.

High temperature layer 30 may be, for example, an InGaN layer having a low InN composition, for example less than 5%, grown to a thickness between 500 and 10,000 angstroms at a temperature between 900 and 1000° C. High temperature layer 30 is generally a material with a bulk lattice constant larger than that of high temperature layer 24. As a result, the in-plane lattice constant in low temperature layer 26 and subsequently grown high temperature layer 28 may be larger than the in-plane lattice constant achievable if low temperature layer 26 is grown directly on high temperature layer 24.

In some embodiments, high temperature layers 30 and 28 in FIG. 11 are composed of InGaN. In one such embodiment, high temperature layer 28 may be grown with less $H_2$ in the ambient, or at lower temperature than high temperature layer 30, in which case, high temperature layer 28 may have a higher InN composition than high temperature layer 30. For example, the difference between the growth temperature of high temperature layer 30 and low temperature layer 26 may be at least 350° C., more preferably at least 400° C., and more preferably at least 450° C. In contrast, the difference between the growth temperature of low temperature layer 26 and high temperature layer 28 may be at least 250° C., more preferably at least 300° C., and more preferably at least 350° C. In another embodiment, high temperature layer 28 may be grown with more $H_2$ or at a higher temperature than high temperature layer 30, in which case high temperature layer 28 may have a lower InN composition than high temperature layer 30. In another embodiment, high temperature layer 28 may be grown under substantially identical conditions to high temperature layer 30, or high temperature layer 28 may have substantially identical composition to high temperature layer 30. In each of these embodiments, low temperature InGaN layer 26 will interrupt the lattice constant of high temperature layer 24 and expand the lattice constant of subsequently grown layers, so high temperature layer 28 will have a larger in-plane lattice constant than high temperature layer 30.

Figure 12:
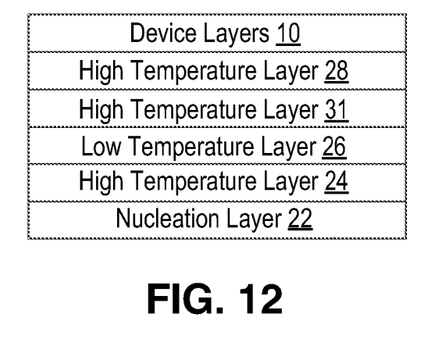
FIG. 12 is a cross sectional view of a portion of a device including two high temperature InGaN layers grown over a low temperature InGaN layer.

In some embodiments of the structure, low temperature layer 26 may establish a large lattice constant while high temperature layer 28 may establish a smooth surface. If the in-plane lattice constant of low temperature layer 26 is substantially larger than the bulk lattice constant of high temperature layer 28, then high temperature layer 28 may be under substantial tensile strain, as defined in Eq. (1), and this tensile strain may be partially relaxed by the formation of cracks or other defects in or near high temperature layer 28. This effect is undesirable as cracks will degrade the electrical and structural integrity of the device, and cracks or other structural defects in layer 28 may reduce the lattice constant in layer 28 and increase the compressive strain in the active region. In some embodiments of the device, it is therefore preferred to grow additional layers between substrate 20 and device layers 10. In one such embodiment, high temperature layer 31 may be disposed between low temperature layer 26 and high temperature layer 28 as shown in FIG. 12. In this embodiment, high temperature layer 31 may be grown at a temperature higher than that of low temperature layer 26, but lower than that of high temperature layer 28. Each of high temperature layers 28 and 31 may be, for example, InGaN grown to a thickness between 500 and 10,000 angstroms, at a temperature between 800 and 1000° C. The InN composition in each high temperature layer may be, for example, between 0.5% and 20%, more preferably between 3% and 6%, more preferably between 4% and 5%.

Alternatively, high temperature layers 28 and 31 may be grown at substantially the same temperature, but high temperature layer 31 may be grown with less $H_2$ in the ambient than that used to grow high temperature layer 28. In this case, high temperature layer 31 may have a higher InN composition than high temperature layer 28. Alternatively, high temperature layer 31 may be grown at higher temperature or with more $H_2$ than high temperature layer 28, in which case high temperature layer 31 may have a lower InN composition than high temperature layer 28.

Figure 13:
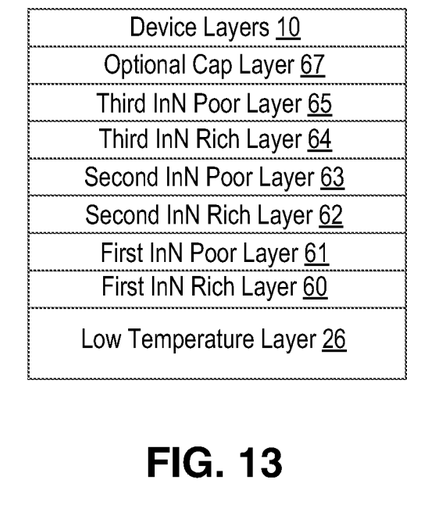
FIG. 13 is a cross sectional view of a portion of a device including multiple indium-rich and indium-poor layers grown by thermal cycled growth.

In another embodiment, more than two distinct layers may be grown between low temperature layer 26 and device layers 10. One example of this embodiment is shown in FIG. 13, where alternating layers of InN rich and InN poor material are included in the multiple layer stack between low temperature layer 26 and device layers 10. Note that the multiple layer stack in FIG. 13 could be grown over nucleation layer 22 of FIG. 2, or over high temperature layer 24 of FIG. 10. Though three sets of InN rich layers and InN poor layers are illustrated in FIG. 13, more or fewer sets may be used. Indium rich layers 60, 62, and 64 may be, for example, InGaN or AlInGaN. Indium poor layers 61, 63, and 65 may be, for example, GaN, InGaN, or AlInGaN. Layers 60, 62, and 64 may have composition of 3% InN, while layers 61, 63, and 65 may have a composition of 0.5% InN.

An optional cap layer 67 may be grown over top InN poor layer 65, then device layers 10 are grown over cap layer 67 or top InN poor layer 65. Cap layer 67 may be, for example, GaN or InGaN. In another embodiment, the top indium poor layer may be omitted and device layers may be grown directly over the top indium rich layer, such as layer 60, 62, or 64.

In another embodiment of the device, the multiple layer stack in FIG. 13 could be formed using thermal cycled growth or annealing, as described in Itoh et al., *Applied Physics Letters*, volume 52, pages 1617-1618 (1988), which is incorporated herein by reference. Thermal cycled growth is used to grow devices with good surface morphology and with a-lattice constants in the device layers greater than a-lattice constants available from growth on conventional GaN templates. Thermal cycled growth processes involve growth of an epitaxial layer such as InGaN, followed by a high temperature growth or annealing step.

After growth of each of layers 60, 61, 62, 63, 64, and 65, growth may be paused by stopping the flow of some precursor gases, such as Ga, Al, and In precursors, then the structure may be annealed by continuing the flow of N precursor, often $NH_3$, while maintaining or raising the temperature for a predetermined amount of time. Growth of the next layer begins when the temperature is adjusted to the growth temperature of the next layer, if necessary, and the appropriate precursors are introduced. Typical annealing conditions consist of 1100° C. for 5 minutes under an ambient of $H_2$ and $NH_3$. $N_2$ can also be added to the ambient or $H_2$ can be removed from the ambient in order to prevent excessive decomposition of the InGaN layers. Alternatively, growth may continue during these high temperature steps or temperature ramps. Annealing after the growth of each layer may result in improved surface morphology over a device that is not annealed after growth of each layer, but annealing after growth of InN poor layers 61, 63, and 65 may result in the formation of extra dislocations or dislocation loops, which may relax some of the strain in the InN poor layers such that these layers are no longer strained to the larger a-lattice constant of the InN rich layers, resulting in a template with a smaller-than-desired a-lattice constant.

Alternatively, the structure is annealed only after growth of some or all of InN rich layers 60, 62, and 64, or only after growth of some or all of InN poor layers 61, 63, and 65. Annealing only after growth of InN poor layers 61, 63, and 65 may result in a higher average InN composition in the template, since the InN poor layers trap more of the InN in the InN rich layers in the device during any annealing steps. In another embodiment, the structure may be annealed after growth of each layer, where the annealing conditions used after growth of indium rich layers are different than the annealing conditions used after growth of the indium poor layers. Note that each of the indium rich layers 60, 62, and 64 need not be identical in composition or thickness. Similarly, each of the indium poor layers 61, 63, and 65 need not be identical in composition or thickness.

Figure 14:
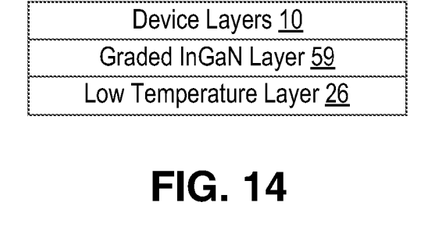
FIG. 14 is a cross sectional view of a portion of a device including a low temperature layer and a graded composition layer.

In another embodiment, graded InGaN layer 59 may be disposed between low temperature layer 26 and device layers 10, as shown in FIG. 14. Graded layer 59 may include, for example, one or more binary, ternary, or quaternary III-nitride layers of varying InN composition. An optional cap layer (not shown in FIG. 14), as described above, may be disposed between graded layer 59 and device layers 10. For example, graded layer 59 may be an InGaN layer with a composition linearly graded from a highest InN composition of 11% adjacent to low temperature layer 26 to a lowest InN composition of 3% adjacent to device layers 10. In another example, graded layer 59 could include a grade from a high InN composition of 10% adjacent to low temperature layer 26 down to a low InN composition of 0% adjacent to device layers 10. In yet another example, graded layer 59 could include a grade or a single step from a high InN composition of 8% adjacent to low temperature layer 26 down to a low InN composition of 0% at some intermediate location, followed by a grade or a single step back up to a higher InN composition of 3% adjacent to device layers 10.

In some embodiments, layers 24 and 30 in FIG. 11 may be used in combination with layers 28 and 31 in FIG. 12. In another embodiment, low temperature layer 26 may be sandwiched between two graded InGaN layers 59, shown in FIG. 14. In another embodiment, an arbitrary stack of low temperature layers 26 may be grown interspersed among an arbitrary stack of high temperature layers or an arbitrary stack of high temperature layers and low temperature GaN layers. Each of the embodiments shown in FIGS. 2, 8, 9, and 10 may include graded layers, multiple layer stacks, and annealed layers or layers grown by thermal cycled growth, as discussed in FIGS. 3 through 7 and FIGS. 11 through 14.

In some embodiments, the characteristics of layers such as high temperature layers 31 in FIG. 12 are selected to lock in the lattice constant established by low temperature layer 26. In some embodiments, the characteristics of layers such as high temperature layers 28 in FIG. 12 are selected to improve the surface morphology in the device.

Figure 15:
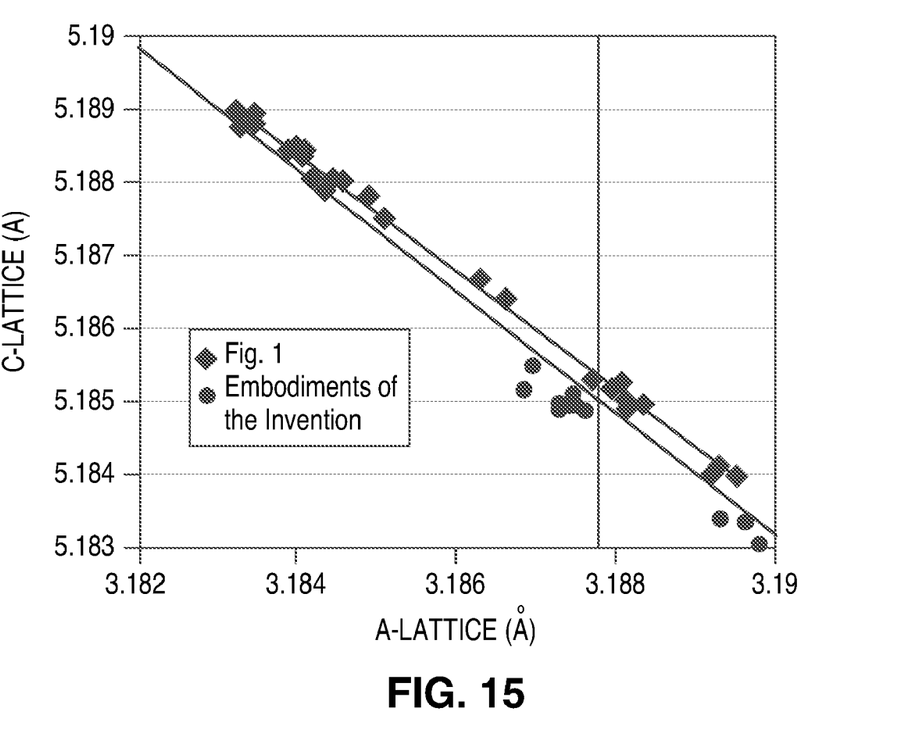
FIG. 15 is a plot of c-lattice constant as a function of a-lattice constant for several devices including a GaN nucleation layer and a thick high temperature GaN layer, and for several devices including a low temperature InGaN layer and a thick high temperature GaN layer.
Figure 16:
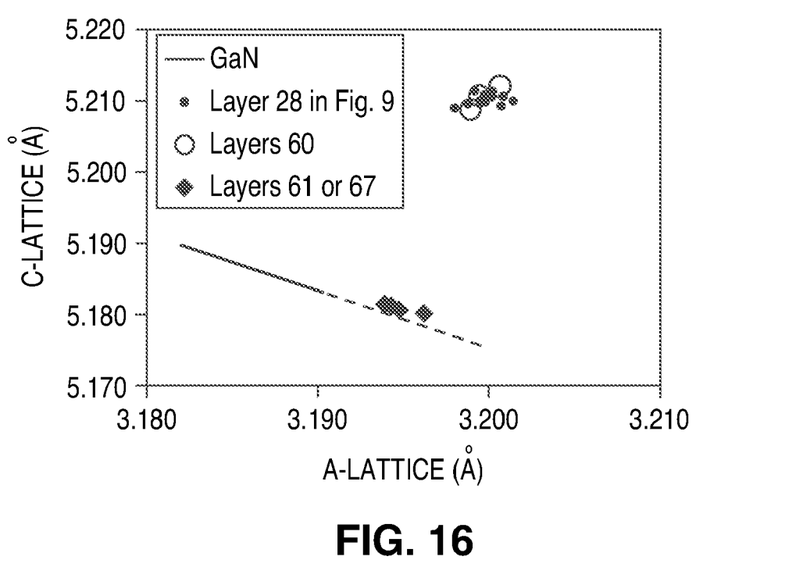
FIG. 16 is a plot of the c- and a-lattice constants for several devices.

FIGS. 15 and 16 are plots of c-lattice constant as a function of a-lattice constant for several devices. FIG. 15 demonstrates that templates according to embodiments of the invention actually cause the overlying layers to at least partially relax. The strain state of a structure can be measured by determining the c- and a-lattice constants of the structure. In the structures represented by diamonds in FIG. 15, a thick high temperature GaN layer 3 was grown over a GaN nucleation layer 2, as illustrated in FIG. 1, where the growth conditions of nucleation layer 2 and high temperature GaN layer 3 were varied in order to vary the threading dislocation density and therefore the in-plane a-lattice constant in the GaN template, as previously discussed with regard to Eq. (3). Such methods of changing threading dislocation density are described in Figge et al., *Journal of Crystal Growth*, volume 221, pages 262-266 (2000), which is incorporated herein by reference. The structures represented by diamonds in FIG. 15 therefore have varying threading dislocation density and a-lattice constant, consistent with Eq. (3). In the structures represented by circles, a thick high temperature GaN layer was grown over a low temperature InGaN layer prepared according to embodiments of the invention. According to elasticity theory, the c- and a-lattice constants in III-nitride materials are inversely related, which is demonstrated by the structures represented by diamonds, which all fall close to the diagonal line illustrated in FIG. 15. In contrast to the structures represented by diamonds, each of the structures represented by circles lies below the diagonal line, meaning that the c-lattice constant of these structures is smaller than that of the structures represented by diamonds. The smaller c-lattice constant of the structures represented by circles suggests that the thick high temperature GaN layers in these structures are grown under tensile strain, indicating that the a-lattice constant of the high temperature GaN layer has been stretched to match the a-lattice constant of the underlying at least partially relaxed low temperature InGaN layer 26. The structures represented by circles also exhibited lower threading dislocation densities for a given a-lattice constant than the structures represented by diamonds, indicating that the invention breaks the tradeoff between a-lattice constant and threading dislocation density observed in conventional GaN templates as previously quantified in Eq. (3).

FIG. 16 is a plot of the c- and a-lattice constants observed for several layers in one or more embodiments of the invention. The closed circles in FIG. 16 represent layer 28 in FIG. 9, while the open circles in FIG. 16 represent one or more indium rich layers in FIG. 13, and the diamond symbols represent one or more indium poor layers or cap layers in FIG. 13. The solid diagonal line in FIG. 16 corresponds to the solid diagonal line previously shown in FIG. 15, and represents experimental data on GaN templates such as the structure illustrated in FIG. 1, while the dashed diagonal line is an extrapolation of the solid line out to larger a-lattice values. As illustrated in FIG. 16, both the c- and a-lattice constants of indium rich layer 60 are quite large compared to the data for conventional GaN templates shown by the diamond symbols in FIG. 15. The c- and a-lattice constants of indium poor layer 61 or cap layer 67 formed over indium rich layer 60 are smaller than the lattice constants of indium rich layer 60, but much larger than the largest a-lattice constants observed for conventional GaN templates in FIG. 15, suggesting that indium poor layers 61 and cap layers 67 grown according to the embodiment illustrated in FIG. 13 are at least partially strained to the larger lattice constant of indium rich layers 60. Note that indium poor layers 61 and cap layers 67 are generally kept thin enough or grown at high enough InN composition to avoid cracking. Device layers 10 grown strained over indium poor layers 61 and cap layers 67 replicate this larger-than-GaN a-lattice constant, which reduces the strain in the light emitting layer. The templates described in the embodiments above may therefore have larger a-lattice constants than conventional GaN templates, which typically have a-lattice constants no larger than 3.189 Å.

Growth of device layers including one or more light emitting layers over templates with a larger in-plane lattice constant than 3.189 Å, such as the structures in some of the embodiments described above, may sufficiently reduce the strain in the light emitting layer to permit thicker light emitting layers to be grown with acceptable defect densities and with reduced spinodal decomposition. For example, an InGaN layer that emits blue light may have the composition $In_{0.12}Ga_{0.88}N$, a composition with a bulk lattice constant of 3.23 Å. The strain in the light emitting layer is determined by the difference between the in-plane lattice constant in the light emitting layer (about 3.189 Å for light emitting layer grown on a conventional GaN buffer layer) and the bulk lattice constant of the light emitting layer, thus strain may be expressed as $|(a_{in\text{-}plane}-a_{bulk})|/a_{bulk}$, as defined in Eq. (2). In the case of a conventional $In_{0.12}Ga_{0.88}N$ layer, the strain is $|(3.189\ Å-3.23\ Å)|/3.23\ Å$, about 1.23%. If a light emitting layer of the same composition is grown on a larger lattice constant template such as the structures described above, the strain may be reduced or eliminated. In some embodiments of the invention, the strain in the light emitting layer of a device emitting light between 430 and 480 nm may be reduced to less than 1%, and more preferably to less than 0.5%. An InGaN layer that emits cyan light may have the composition $In_{0.16}Ga_{0.84}N$, a composition with a bulk lattice constant of 3.24 Å and strain of about 1.7% when grown on a conventional GaN buffer layer. In some embodiments of the invention, the strain in the light emitting layer of a device emitting light between 480 and 520 nm may be reduced to less than 1.5%, and more preferably to less than 1%. An InGaN layer that emits green light may have the composition $In_{0.2}Ga_{0.8}N$, a composition with a bulk lattice constant of 3.26 Å, resulting in strain of about 2.1% when grown on a conventional GaN buffer layer. In some embodiments of the invention, the strain in the light emitting layer of a device emitting light between 520 and 560 nm may be reduced to less than 2%, and more preferably to less than 1.5%.

For the device illustrated in FIG. 2, the inventors have grown structures with a-lattice constants as large as 3.212 Å and threading dislocation densities as low as $4\times10^9$ cm$^{-2}$. A light emitting layer grown over such a structure may be 0.55% strained for a blue light emitting layer, 0.87% strained for a cyan light emitting layer, and 1.5% strained for a green light emitting layer. For the devices illustrated in FIGS. 8 and 10, the inventors have grown structures with a-lattice constants as large as 3.196 Å and threading dislocation densities as low as $1.5\times10^9$ cm$^{-2}$. A light emitting layer grown over such a structure may be 1.1% strained for a blue light emitting layer, 1.4% strained for a cyan light emitting layer, and 2.0% strained for a green light emitting layer. For devices illustrated in FIG. 9 and 13, the inventors have grown structures with a-lattice constants as large as 3.202 Å and threading dislocation densities as low as $1.5\times10^9$ cm$^{-2}$, as illustrated in FIG. 16. A light emitting layer grown over such a structure may be 0.87% strained for a blue light emitting layer, 1.2% strained for a cyan light emitting layer, and 1.8% strained for a green light emitting layer. For devices illustrated in FIG. 11, the inventors have grown structures with a-lattice constants as large as 3.204 Å and threading dislocation densities as low as $1.5 \times 10^9$ cm$^{-2}$. A light emitting layer grown over such a structure may be 0.8% strained for a blue light emitting layer, 1.1% strained for a cyan light emitting layer, and 1.7% strained for a green light emitting layer. Each of these examples therefore breaks the relationship between in-plane a-lattice constant and threading dislocation density previously described in Eq. (3).

Figure 17:
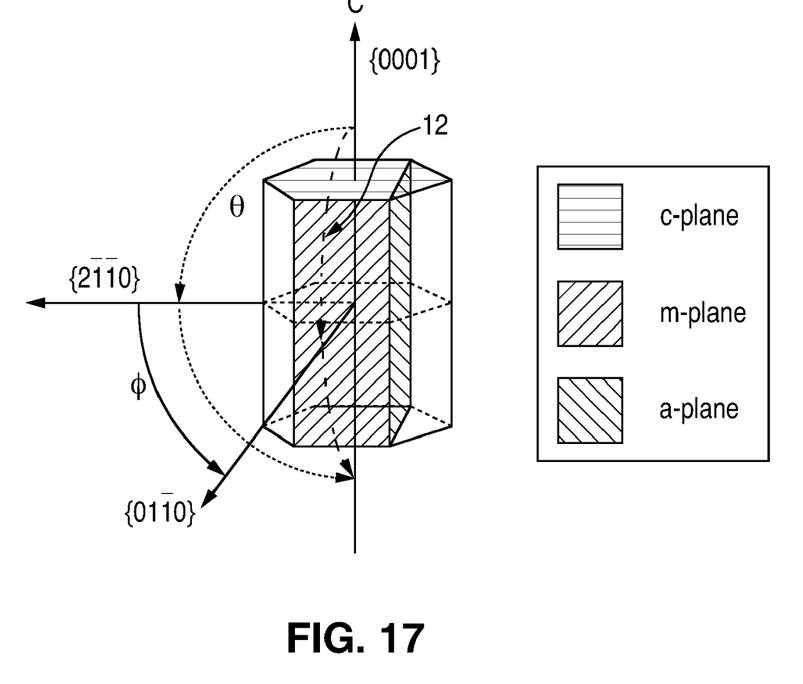
FIG. 17 illustrates several major crystallographic planes of a wurtzite structure such as sapphire.

The growth templates described above and device layers may be grown on a surface of a sapphire or SiC growth substrate that is tilted from a major crystallographic plane of the sapphire, according to embodiments of the invention. FIG. 17 illustrates the c-plane, m-plane, and a-plane of sapphire. III-nitride devices are often grown over the c-plane, r-plane, m-plane, or a-plane of sapphire. In embodiments of the invention, a sapphire substrate may be sliced and polished such that the growth surface over which the III-nitride device layers are grown is tilted in a direction 12 from the c-plane, r-plane, m-plane, or a-plane, for example by more than 0.1°. A light emitting layer grown over such a substrate may experience reduced spinodal decomposition and reduced strain in the light emitting layers. Such a substrate may be used to grow any of the templates described above.

The semiconductor structures illustrated and described above may be included in any suitable configuration of a light emitting device, such as a device with contacts formed on opposite sides of the device or a device with both contacts formed on the same side of the device. When both contacts are disposed on the same side, the device may be formed either with transparent contacts and mounted such that light is extracted either through the same side on which the contacts are formed, or with reflective contacts and mounted as a flip chip, where light is extracted from the side opposite the side on which the contacts are formed.

Figure 18:
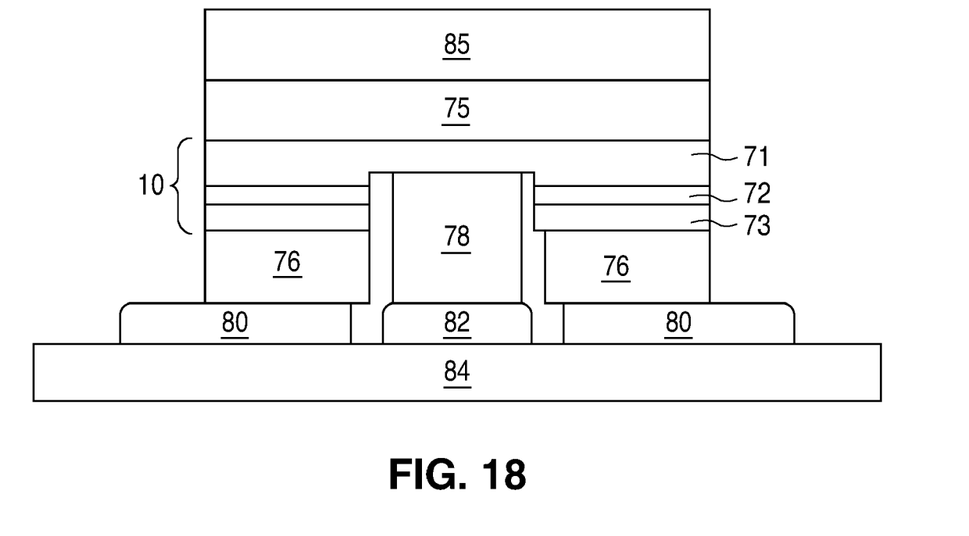
FIG. 18 illustrates a portion of a flip chip light emitting device from which the growth substrate has been removed.

FIG. 18 illustrates a portion of one example of a suitable configuration, a flip chip device from which the growth substrate has been removed. As described above, device layers 10 include a light emitting region 72 including at least one light emitting layer sandwiched between an n-type region 71 including at least one n-type layer and a p-type region 73 including at least one p-type layer. N-type region 71 may be a portion of the growth template, or a separate structure. A portion of p-type region 73 and light emitting region 72 is removed to form a mesa that exposes a portion of n-type region 71. Though one via exposing a portion of n-type region 71 is shown in FIG. 18, it is to be understood that multiple vias may be formed in a single device. N— and p-contacts 78 and 76 are formed on the exposed parts of n-type region 71 and p-type region 73, for example by evaporating or plating. Contacts 78 and 76 may be electrically isolated from each other by air or a dielectric layer. After contact metals 78 and 76 are formed, a wafer of devices may be diced into individual devices, then each device is flipped relative to the growth direction and mounted on a mount 84, in which case mount 84 may have a lateral extent larger than that of the device, as illustrated in FIG. 18. Alternatively, a wafer of devices may be connected to a wafer of mounts, then diced into individual devices. Mount 84 may be, for example, semiconductor such as Si, metal, or ceramic such as AlN, and may have at least one metal pad 80 which electrically connects to p-contacts 76 and at least one metal pad 82 which electrically connects to the n-contacts 78. Interconnects (not shown in FIG. 18) disposed between contacts 76 and 78 and pads 80 and 82 connect the semiconductor device to mount 84. The interconnects may be, for example, elemental metals such as gold, or solder.

After mounting, the growth substrate (not shown) is removed by a process suitable to the substrate material, such as etching or laser melting. A rigid underfill may be provided between the device and mount 84 before or after mounting to support the semiconductor layers and prevent cracking during substrate removal. Template 75, on which device layers 10 are grown, may be left intact, completely removed, or partially removed, for example by etching. The surface exposed by removing the growth substrate and any semiconductor material may be roughened, for example by an etching process such as photoelectrochemical etching or by a mechanical process such as grinding. Roughening the surface from which light is extracted may improve light extraction from the device. Alternatively, a photonic crystal structure may be formed in the surface. A structure 85 such as a phosphor layer or secondary optics known in the art such as dichroics or polarizers may be applied to the emitting surface.

Figure 19:
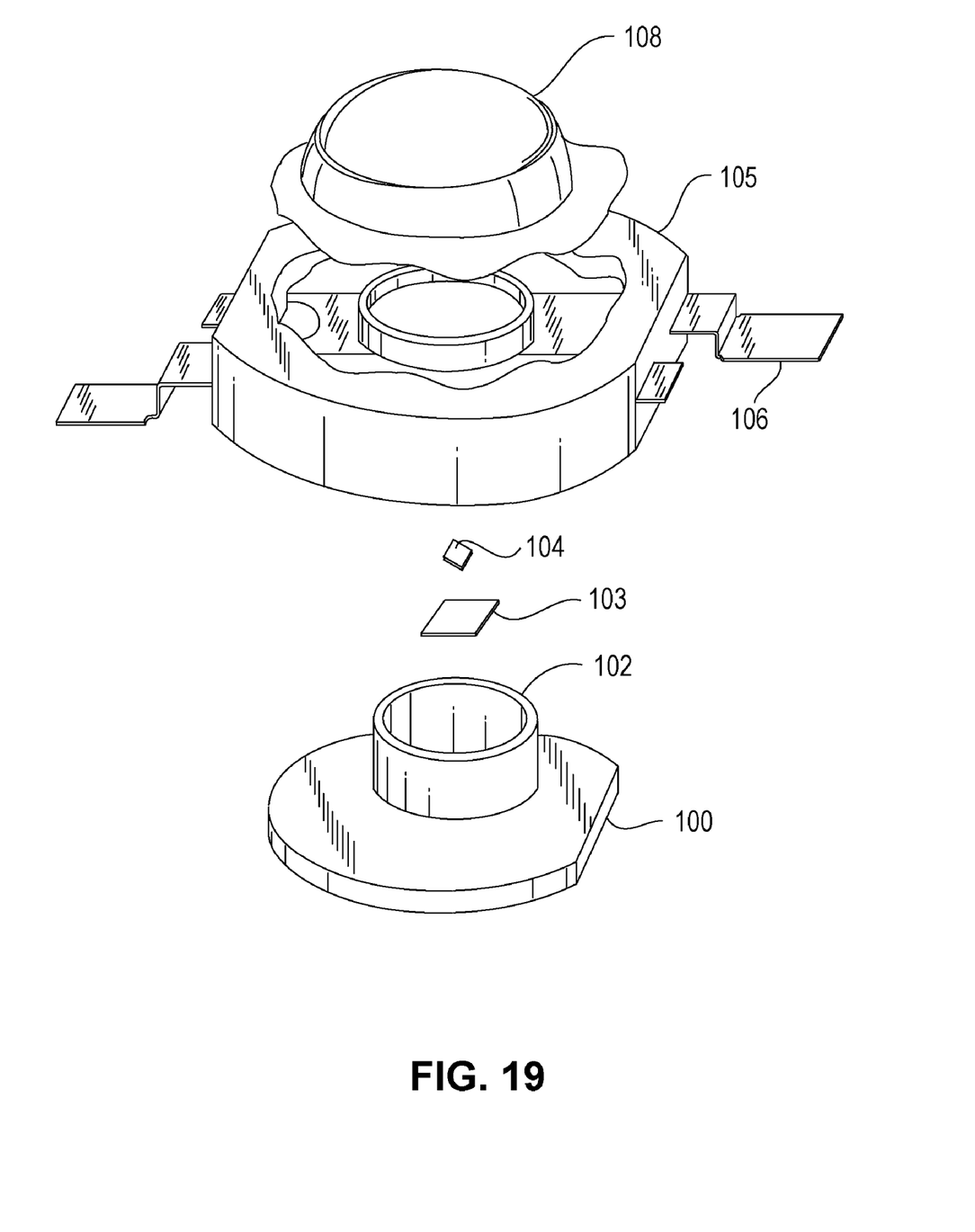
FIG. 19 is an exploded view of a packaged light emitting device.

FIG. 19 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described. In particular, low temperature layer 26 may be composed of AlGaN or AlInGaN instead of InGaN. For the embodiment where low temperature layer 26 is composed of AlGaN, the in-plane lattice constant of low temperature layer 26 is smaller than that of nucleation layer 22, which will decrease the strain in AlGaN or AlInGaN layers used for short wavelength UV emitters. For embodiments where low temperature layer 26 is composed of AlInGaN, the in-plane lattice constant of low temperature layer 26 may be either larger or smaller than that of layer 22, depending on the indium to aluminum ratio in low temperature layer 26. Also, the invention disclosed herein may be applied to electronic or optoelectronic devices as well as light emitting devices, for example including transistors such as FETs or detectors.

What is being claimed is:

1. A device comprising: a III-nitride structure comprising:
   a first layer, wherein the first layer is substantially free of indium;
   a second layer grown over the first layer, wherein the second layer is a non-single crystal layer comprising indium;
   a third layer disposed between the first layer and the second layer and in direct contact with the first layer, wherein the third layer is a non-single crystal layer substantially free of indium; and
   device layers grown over the second layer, the device layers comprising a III-nitride light emitting layer disposed between an n-type region and a p-type region.

2. The device of claim 1 wherein the first layer is GaN and the second layer is InGaN.

3. The device of claim 1 further comprising a layer having a graded composition disposed between the light emitting layer and the first layer.

4. A The device comprising: a III-nitride structure comprising:
a first layer, wherein the first layer is substantially free of indium;
a second layer grown over the first layer, wherein the second layer is a non- single crystal layer comprising indium;
device layers grown over the second layer, the device layers comprising a III- nitride light emitting layer disposed between an n-type region and a p-type region; and
a third layer disposed between the second layer and the light emitting layer and in direct contact with the second layer, wherein the third layer is a non-single crystal layer comprising indium.

5. The device of claim 1 wherein the light emitting layer is doped with silicon to a dopant concentration between $1 \times 10^{18}$ cm$^{-3}$ and $1 \times 10^{20}$ cm$^{-3}$.

6. The device of claim 1 wherein the structure is grown over a surface of a substrate which is tilted from a major crystallographic plane of the substrate by at least 0.1°.

7. The device of claim 1 wherein the light emitting layer has a thickness greater than 15 angstroms.

8. The device of claim 1 wherein the light emitting layer has a thickness greater than 50 angstroms.

9. The device of claim 1 wherein the light emitting layer is doped with silicon to a dopant concentration between $1 \times 10^{18}$ cm$^{-3}$ and $1 \times 10^{20}$ cm$^{-3}$.

10. The device of claim 1 further comprising:
contacts electrically connected to the n-type region and the p-type region; and
a cover disposed over the III-nitride structure.

11. A device comprising: a III-nitride structure comprising:
a first layer, wherein the first layer is substantially free of indium;
a second layer grown over the first layer, wherein the second layer is a non-single crystal layer comprising indium;
device layers grown over a second layer, the device layers comprising a III-nitride light emitting layer disposed between an n-type region and a p-type region; and
a third layer disposed between the second layers and the light emitting layer and in direct contact with the second layer, wherein the third layer is a non-single crystal layer comprising indium.

12. The device of claim 11 wherein the second layer has a different indium composition than the third layer.

13. A device comprising:
a first substantially single crystal layer;
a second substantially single crystal layer; and
a non-single crystal layer comprising indium disposed between the first and second substantially single crystal layers.

14. The device of claim 13 wherein the III-nitride structure further comprises a light emitting layer disposed between an n-type region and a p-type region, wherein the second substantially single crystal layer is disposed between the light emitting region and the non-single crystal layer.

15. The device of claim 14 wherein a composition of the first substantially single crystal layer is different from a composition of the second substantially single crystal layer.

16. The device of claim 14 wherein:
the first substantially single crystal layer is GaN or InGaN;
the second substantially single crystal layer is InGaN; and
the second substantially single crystal layer has a larger InN composition that the first substantially single crystal layer.

17. The device of claim 14 wherein the second substantially single crystal layer has a larger in-plane a-lattice constant than the first substantially single crystal layer.

18. The device of claim 14 wherein the non-single crystal layer is InGaN.

19. The device of claim 14 further comprising a third substantially single crystal layer disposed between the first substantially single crystal layer and the non-single crystal layer.

20. The device of claim 14 further comprising a third substantially single crystal layer disposed between the non-single crystal layer comprising indium and the light emitting layer.

21. The device of claim 14 wherein:
the light emitting layer has bulk lattice constant $a_{bulk}$ corresponding to a lattice constant of a free standing material of a same composition as the light emitting layer;
the light emitting layer has an in-plane lattice constant $a_{in\text{-}plain}$ corresponding to a lattice constant of the light emitting layer as grown in the structure; and
$|(a_{in\text{-}plane}-a_{bulk})|/a_{bulk}$ in the light emitting layer is less than 1%.

22. The device of claim 14 wherein the light emitting layer has an a-lattice constant greater than 3.189 angstroms.

23. The device of claim 14 wherein the structure is grown over a surface of a substrate which is tilted from a major crystallographic plane of the substrate by at least 0.1°.

24. The device of claim 14 wherein the light emitting layer has a thickness greater than 50 angstroms.

25. The device of claim 14 wherein the light emitting layer has a thickness greater than 15 angstroms.

26. The device of claim 14 wherein the light emitting layer is doped with silicon to a dopant concentration between $1 \times 10^{18}$ cm$^{-3}$ and $1 \times 10^{20}$ cm$^{-3}$.

27. The device of claim 14 further comprising:
contacts electrically connected to the n-type region and the p-type region; and
a cover disposed over the III-nitride structure.

28. A device comprising:
a III-nitride structure comprising a light emitting layer disposed between an n-type region and a p-type region, wherein:
a threading dislocation density in the light emitting layer is less than $3 \times 10^9$ cm$^{-2}$; and
an a-lattice constant in the light emitting layer is greater than 3.200 Å.

* * * * *

UNITED STATES PATENT AND TRADEMARK OFFICE
CERTIFICATE OF CORRECTION

PATENT NO. : 7,547,908 B2
APPLICATION NO. : 11/615834
DATED : June 16, 2009
INVENTOR(S) : Patrick N. Grillot et al.

It is certified that error appears in the above-identified patent and that said Letters Patent is hereby corrected as shown below:

Column 19, line 4-17: Cancel Claim 4

"4. A The device comprising:

a III-nitride structure comprising:

a first layer, wherein the first layer is substantially free of indium;

a second layer grown over the first layer, wherein the second layer is a non-single crystal layer comprising indium;

device layers grown over the second layer, the device layers comprising a III-nitride light emitting layer disposed between an n-type region and a p-type region; and a third layer disposed between the second layer and the light emitting layer and in direct contact with the second layer, wherein the third layer is a non-single crystal layer comprising indium."

And substitute:

--4. The device of claim 1 wherein:

the light emitting layer has bulk lattice constant $a_{bulk}$ corresponding to a lattice constant of a free standing material of a same composition as the light emitting layer;

the light emitting layer has an in-plane lattice constant $a_{in-plane}$ corresponding to a lattice constant of the light emitting layer as grown in the structure; and $|(a_{in-plane} - a_{bulk})|/a_{bulk}$ in the light emitting layer is less than 1%.--

Column 19, line 18-20, Cancel Claim 5

"5. The device of claim 1 wherein the light emitting layer is doped with silicon to a dopant concentration between $1 \times 10^{18}$ cm$^{-3}$ and $1 \times 10^{20}$ cm$^{-3}$."

And substitute:

--5. The device of claim 1 wherein the light emitting layer has an a-lattice constant greater than 3.189 angstroms.--

Signed and Sealed this

Twentieth Day of April, 2010

David J. Kappos
*Director of the United States Patent and Trademark Office*